United States Patent [19]

Akatsuka et al.

[11] Patent Number: 5,472,909
[45] Date of Patent: Dec. 5, 1995

[54] METHOD FOR THE PREPARATION OF DISCRETE SUBSTRATE PLATES OF SEMICONDUCTOR SILICON WAFER

[75] Inventors: Takeshi Akatsuka; Tsutomu Sato, both of Niigata, Japan

[73] Assignee: Naoetsu Electronics Company, Niigata, Japan

[21] Appl. No.: 340,851

[22] Filed: Nov. 15, 1994

Related U.S. Application Data

[63] Continuation-in-part of Ser. No. 246,401, May 20, 1994, abandoned.

[30] Foreign Application Priority Data

May 21, 1993 [JP] Japan ................................ 5-142685

[51] Int. Cl.$^6$ ........................ H01L 21/302; H01L 21/225
[52] U.S. Cl. ........................ 437/160; 437/153; 437/226; 437/249
[58] Field of Search ........................ 437/160, 164, 437/226, 439, 153, 249, 247; 148/DIG. 28; 156/636, 645; 125/13.02, 15

[56] References Cited

U.S. PATENT DOCUMENTS

| | | | |
|---|---|---|---|
| 4,188,245 | 2/1980 | Chang et al. | 437/160 |
| 4,720,469 | 1/1988 | Kesar et al. | 437/160 |
| 5,024,867 | 6/1991 | Iwabuchi | 437/160 |
| 5,074,276 | 12/1991 | Katayama | 125/13.02 |
| 5,094,976 | 3/1992 | Iwabuchi et al. | 437/160 |
| 5,171,708 | 12/1992 | Katayama et al. | 437/160 |
| 5,219,632 | 7/1993 | Shimakura et al. | 437/939 |
| 5,225,367 | 7/1993 | Yamazaki et al. | 437/160 |
| 5,227,339 | 7/1993 | Kisui | 437/226 |

FOREIGN PATENT DOCUMENTS

| | | | |
|---|---|---|---|
| 39178A | 4/1978 | Japan | 437/160 |
| 1293613 | 11/1989 | Japan | 437/226 |

*Primary Examiner*—Olik Chauduri
*Assistant Examiner*—S. Mulpuri
*Attorney, Agent, or Firm*—Wenderoth, Lind & Ponack

[57] ABSTRACT

An efficient method is proposed for the preparation of a silicon single crystal wafer for discrete semiconductor devices, such as transistors, deeply doped with a dopant on one surface, the other surface being mirror-polished. Different from the conventional process in which a single base wafer is subjected to a deposition doping and drive-in doping treatments to form a deeply doped layer on each of the surfaces followed by removal of one of the doped layers and lapping and mirror-polishing the surface, the improvement of the invention can be obtained by subjecting a base wafer having an increased thickness to the deposition and drive-in doping treatments to form deeply doped layers on both surfaces leaving an undoped layer in-between followed by slicing this base wafer by using an annular slicing blade having a thickness specifically correlated to the thickness of the starting wafer along the undoped layer into two separate wafers each having a laminar structure consisting of a doped layer and an undoped layer which are each lapped and mirror polished on the surface of the undoped layer.

1 Claim, 3 Drawing Sheets

METHOD FOR THE PREPARATION OF DISCRETE SUBSTRATE PLATES OF SEMICONDUCTOR SILICON WAFER

BACKGROUND OF THE INVENTION

This is a continuation-in-part application from a copending United States patent application Ser. No. 08/246,401 filed May 20, 1994, now abandoned.

The present invention relates to a method for the preparation of substrate plates of semiconductor silicon wafer for discrete electronic devices such as transistors, diodes and the like, referred to simply as discrete substrates hereinafter. More particularly, the invention relates to a method for the preparation of discrete substrate plates of semiconductor silicon wafer deeply diffusion-doped on one surface.

Discrete substrate plates of semiconductor silicon wafer are prepared conventionally by a method described below. Namely, wafers are first obtained by slicing a cylindrical single crystal rod of a silicon semiconductor and lapping the surfaces with an abrasive powder, optionally, followed by a chemical etching treatment. A plural number of the thus lapped silicon wafers are arranged to stand on a boat of fused silica glass keeping a definite gap space each from the adjacent ones and brought into a diffusion tube in which the silicon wafers are heated at a specified temperature and for a specified length of time under a gaseous atmosphere composed of a carrier gas such as a mixture of nitrogen and oxygen containing a small amount of a gaseous compound of a dopant element such as phosphorus and boron to cause deposition of the desired dopant element on the surfaces of the respective silicon wafer forming a deposition-doped surface layer having a very small thickness but in a relatively high concentration of the dopant.

Following the above described deposition treatment of a dopant, the silicon wafers are arranged on another boat of still higher refractoriness such as silicon carbide to stand in a closely packed state with a layer of an inert powder such as silica interposed between adjacent wafers and heated in a diffusion tube at a specified high temperature for a specified relatively long time under an atmosphere of a carrier gas such as a mixture of nitrogen and oxygen so that the dopant in the very surface layer causes diffusion into a desired depth of the wafer so that the concentration of the dopant in the surface layer can be decreased to an appropriate desired level. This secondary diffusion treatment is called a drive-in diffusion process. Since a discrete substrate plate of silicon wafer is required to have one of the surfaces diffusion-doped in the above described manner but to have the other surface in a mirror-polished condition, the silicon wafer after the above described drive-in diffusion is ground on one surface to remove the doped layer so as to expose the surface of the undoped layer having a specified thickness followed by lapping and mirror-polishing to finish a substrate plate for discrete electronic devices.

The above described conventional method for the preparation of discrete substrate plates has several problems. For example, the surface of the silicon wafer after the drive-in diffusion treatment mostly has a grained structure consisting of so-called "particulates" as a consequence of the heating treatment at a high temperature for a long time in an atmosphere containing both of nitrogen and oxygen. It is known that the above mentioned "particulates" have a chemical composition consisting of silicon, nitrogen, oxygen, the dopant element, i.e. phosphorus or boron, and other unidentified constituents. The "particulates" have a crystalline structure of very high perfectness growing in the direction of the crystalline axis of the base silicon wafer. In addition, the "particulates" are chemically very stable and cannot be dissolved not only in hydrofluoric acid but also in aqua regia so that it is a difficult matter to completely remove the "particulates" from the grained wafer surface by a simple method. When a silicon wafer having the "particulates" on the surface is processed as such in the subsequent steps such as mechanical working, further diffusion treatment, washing and so on, the "particulates" eventually fall off the wafer surface to cause various troubles.

FIGS. 1A, 1B and 1C are each a scanning electron microscopic photograph for illustration of the "particulates" formed on the surface of a silicon semiconductor wafer after the drive-in diffusion treatment followed by a short etching treatment in order to improve the visibility of the image of the "particulates". The silicon wafers were prepared from a single crystal grown by the floating-zone melting method referred to as the FZ method hereinafter, in the crystallographic <111> direction. It is understood therefrom that growth of the "particulates" took place on something like a nucleus at the center making an angle of 120° with the crystallographic axis.

The mechanism for the formation of the above mentioned "particulates" was previously understood in such a way that the stress caused in the surface layer of the silicon wafer by the mechanical working such as lapping is responsible therefor. Accordingly, it was a general understanding that occurrence of "particulates" on the wafer surface by the drive-in diffusion treatment could be prevented by subjecting the silicon wafer before the diffusion process to an etching treatment to remove the work-stressed surface layer to a depth of, for example, 20 μm. This method, however, is not quite satisfactory for the reasons mentioned below.

While most of the silicon wafers used for discrete substrate plates have a fiat surface in parallel with the crystallographic plane of (111) or (100), firstly, the method of chemical etching is not so effective for the (100) wafer surfaces although the method is considerably effective for the (111) wafer surfaces. In particular, the method is quite ineffective for the (100) wafers for MOS-type power devices having a deep diffusion layer of, for example, 250 to 300 μm thickness.

Although the method is effective when applied to a (111) silicon wafer, secondly, removal of the work-stressed layer by etching from the wafer surface causes another problem that the so-called gettering activity as an inherent property of the work-stressed surface is naturally lost resulting in the loss of the absorbing activity for the dislocations occurring as a consequence of the intrusion of the dopant into the undoped zone in the process of the drive-in diffusion so that dislocations are formed in a remarkably uneven distribution on the undoped surface. When the discrete electronic device to be manufactured from such a silicon wafer is a transistor, for example, the undoped layer serves for the formation of the base and emitter of the transistor so that the unevenly distributed dislocations naturally results in the degradation or variation of the performance of the device.

The above mentioned surface condition is illustrated in FIG. 2A showing an optical microscopic photograph of the mirror-polished surface of a (111) silicon wafer having a doped surface layer of 160 μm thickness and an undoped surface layer of 90 μm thickness. The mirror-polished surface of the wafer was subjected to an etching treatment so as to transform each of the dislocations into a triangular etch pit. The bright striped areas, shown in FIG. 3 by a further magnification, show crowding of the dislocations.

SUMMARY OF THE INVENTION

The present invention accordingly has an object to provide a method for the preparation of substrate plates of semiconductor silicon wafer for discrete electronic devices deeply diffusion-doped on one surface, according to which occurrence of "particulates" can be prevented on the surface of the silicon wafer after the drive-in diffusion treatment along with a decrease in number and an increase in the uniformity of the distribution of dislocations regardless of the crystallographic orientation of the wafer surface which may be along the (111) plane or the (100) plane.

Thus, the method of the present invention for the preparation of discrete substrate plates of semiconductor silicon wafer deeply diffusion-doped on one surface comprises the steps of:

(a) subjecting a single crystal wafer of silicon semiconductor, of which the crystallographic orientation of the surface plane is either along the (111) plane or along the (100) plane of the single crystal silicon, after a simultaneous lapping treatment of both surfaces to a first doping treatment, referred to as a deposition doping treatment hereinafter, with a dopant by heating the silicon wafer in an atmosphere containing the dopant so as to deposit the dopant on both of the surfaces of the silicon wafer;

(b) subjecting the silicon wafer after the first doping treatment with the dopant to a second doping treatment, referred to as a drive-in diffusion treatment hereinafter, of the dopant by heating the silicon wafer at a temperature, for example, in the range from 1250° to 1310° C. in an atmosphere of a gaseous mixture consisting of from 99.5% to 90% by volume of argon or helium and from 0.5% to 10% by volume of oxygen for a length of time, for example, in the range from 20 to 450 hours so as to cause diffusion of the dopant to the inside layers of the silicon wafer from the respective surfaces leaving an undoped layer in-between;

(c) slicing the silicon wafer after step (b) on an internal-blade slicing machine along the undoped layer into two silicon wafers each having a thickness smaller than one half of the thickness of the starting silicon wafer and each having a doped surface and an undoped surface; and (d) grinding and polishing the surface of the undoped layer of each of the silicon wafers obtained in step (c) into a mirror-polished surface.

DETAILED DESCRIPTION OF THE PREFERRED EMBODIMENTS

Figure 1A:
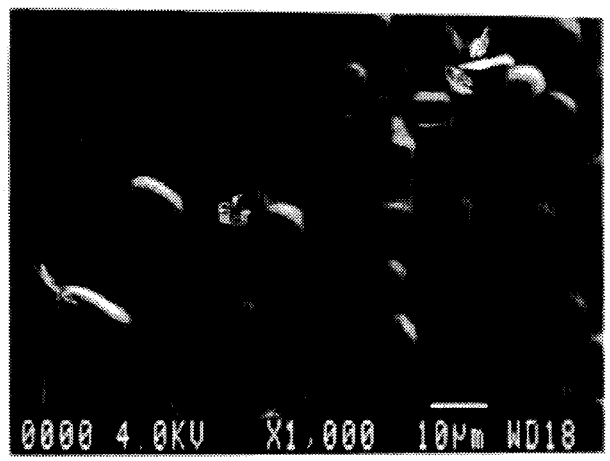
FIGS. 1A, 1B and 1C are each a scanning electron microscopic photograph showing the "particulates" formed on the surface of a silicon wafer after the drive-in diffusion treatment.
Figure 1B:
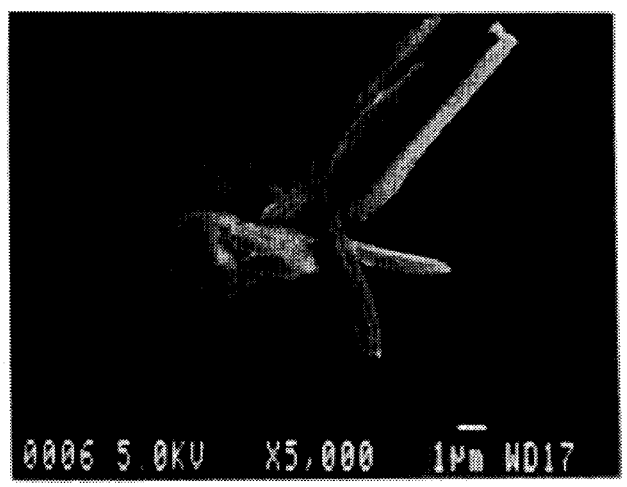
Figure 1C:

As is described above, it is almost unavoidable in the prior art method for the preparation of discrete substrate plate of silicon wafer that a large number of "particulates" are formed on both surfaces of the silicon wafer in the drive-in diffusion process, as is shown in FIGS. 1A, 1B and 1C, to cause various troubles in the subsequent steps. The factor responsible for the formation of "particulates" is considered to be the stress in the surface layer of the wafer caused in the step of lapping so that the countermeasure conventionally undertaken against this phenomenon is a chemical etching treatment to remove the stressed surface layer having a thickness of, for example, 20 µm.

The above mentioned method, however, is effective only for the silicon wafers of the (111) crystallographic orientation of the surface and little effective for the (100) wafers or, in particular, quite ineffective for the (100) wafers having a deep diffusion layer of, for example, 250 to 300 µm depth for the power MOS-type field-effect transistors. Further, removal of the work-stressed surface layer of the silicon wafer naturally leads to the loss of the so-called gettering action to absorb the dislocations occurring in the undoped layer as a consequence of the intrusion of dopants in the drive-in diffusion process resulting in occurrence of a large number of dislocations on the surface of the undoped layer in a distribution with remarkable non-uniformity. When the discrete device is a transistor, the undoped layer is provided thereon with the base and emitter of the transistor so that the non-uniform distribution of dislocations on the undoped layer is very detrimental against the performance of the transistor, in particular, in relation to the leak current and variations thereof.

The above described problems can be solved by the method of the present invention having effectiveness regardless of the crystallographic orientation of the wafer surface which can be either along the (111) or (100) to prevent occurrence of "particulates" and to ensure a decrease in number and uniform distribution of dislocations.

In the inventive method, a single crystal silicon rod grown in the crystallographic direction of <111> or <100> is sliced perpendicularly to the axis thereof to prepare wafers which are subjected to a lapping treatment simultaneously on both surfaces by using an abrasive of FO #1000 or #1200 fineness to lap off the surface layers each by a thickness of, for example, 50 µm. The thus prepared silicon wafer, which has relatively uniform work-stress in the surface layer of a few µm thickness, is subjected, in step (a), to the first doping treatment of a dopant by heating the wafer in an atmosphere containing the dopant so as to deposit the dopant on both surfaces of the wafer in a relatively high concentration.

In step (b) of the inventive method, the silicon wafer after the deposition-doping treatment in step (a) is subjected to a second doping treatment, i.e. drive-in diffusion treatment, by heating the silicon wafer after the deposition doping treatment at a temperature, for example, in the range from 1250° to 1310° C. in an atmosphere of a gaseous mixture consisting of from 99.5% to 90% by volume of argon or helium and from 0.5% to 10% by volume of oxygen for a length of time, for example, in the range from 20 to 450 hours so as to cause diffusion of the dopant to the inside layers of the silicon wafer from the respective surfaces leaving an undoped layer in-between.

In step (c) of the inventive method, the silicon wafer after the drive-in diffusion treatment is sliced in parallel to the surface thereof along the undoped layer left between the doped layers by using an internal-blade slicing machine into two wafers each consisting of a doped layer and an undoped layer followed, in step (d), by grinding and mirror-polishing of the surface of the undoped layer to finish two discrete substrates.

It should be noted that the silicon wafer obtained by slicing of a single crystal rod and subjected to the deposition-doping treatment in step (a), referred to as the base wafer hereinafter, should have a thickness $t_2$ within the range defined by the inequalities:

$$2(x_f+x_i)+t_c+75 \leq t_2 \leq 2(x_f+x_i)+t_c+300, \quad (I)$$

in which $t_2$ is the thickness of the wafer in μm, $t_c$ is the thickness of the slicing blade mounted on the internal-blade slicing machine in μm, $x_f$ is the thickness in μm of each of the doped layers formed in step (a), and $x_i$ is the thickness in μm of the undoped layer in each of the discrete substrates after step (d). Namely, the base wafer must have a thickness of as large as about twice of the thickness of conventional base plates or somewhat larger by taking into account the amount of the base wafer lost by slicing with a blade having a thickness $t_c$ in step (c) as well as the thickness of each of the divided wafers lost by the grinding and mirror-polishing works in step (d) which is estimated to be somewhere between 75 μm and 300 μm as a total for the two divided wafers. In other words, it is estimated that the thickness of each of the wafers lost by grinding and polishing in step (d) is at least 37.5 μm but never exceeds 150 μm in view of the costs therefor excepting for an exceptional case in which a still larger thickness of the undoped layer is removed with an object to particularly decrease the number of dislocations. A base wafer having such an increased thickness is advantageous in respect of occurrence of dislocations by virtue of the increase in the thickness of the undoped layer between the doped layers to detect stress concentration. Taking a wafer of which the thickness of the doped layer is 160 μm and the thickness of the undoped layer is 90 μm as an example, the level of dislocations can be as small as one tenth for a FZ-grown single crystal and one half to one third for a single crystal grown by the Czochralski method as compared with that in a conventional method.

In the drive-in diffusion treatment of step (b), it is essential that the atmospheric gas for the treatment is a gaseous mixture of 90% to 99.5% by volume of an inert gas such as argon and helium and from 0.5% to 10% by volume of oxygen. When the content of oxygen is too small, a silicon dioxide film is formed on the wafer surface only incompletely during the diffusion treatment at an elevated temperature for a long time so that evaporation of the silicon atoms cannot be fully prevented while, when the content of oxygen is too large, a silicon dioxide film formed on the wafer surface has an excessively large thickness eventually resulting in a roughened surface condition with craters and cracks.

In the following, the method of the present invention is illustrated in more detail by way of examples and comparative examples, which, however, never limit the scope of the invention in any way.

EXAMPLE 1.

A lapped base wafer of semiconductor silicon having a diameter of 100 mm and thickness of 980 μm was prepared by slicing a single crystal rod of semiconductor silicon grown by the FZ method in the crystallographic <111> direction followed by simultaneous lapping of both surfaces with an abrasive powder of FO #1200 fineness. The silicon wafer was subjected to the deposition-doping treatment of phosphorus dopant by heating in an atmosphere containing phosphorus according to a conventional procedure at 1130° C. for 150 minutes to deposit the dopant on both of the surfaces to give a deposition-doped wafer.

The thus deposition-doped silicon wafer was then subjected to a drive-in diffusion treatment by heating in a diffusion tube of silicon carbide at a temperature of 1280° C. for 150 hours in an atmosphere of a gaseous mixture consisting of 95% by volume of argon and 5% by volume of oxygen which was passed through the diffusion tube at a rate of 1050 ml per minute so that diffusion-doped layers were formed each having a thickness of 160 μm from the respective surfaces leaving an undoped layer therebetween in a thickness of about 660 μm.

The base wafer after the drive-in diffusion treatment was mounted on an internal-blade slicing machine and sliced into two wafers along the center plane of the undoped layer by using an annular blade having a thickness of 330 μm into two wafers each having a thickness of 325 μm having a laminar structure consisting of a doped layer of 160 μm thickness and an undoped layer of 165 μm thickness, Each of the wafers obtained by slicing the base wafer was ground and mirror-polished on the surface of the undoped layer to give two finished discrete substrate plates of each 250 μm thickness, which were subjected to the following tests.

Thus, the surface of the doped layer of the discrete substrate was slightly etched with hydrofluoric acid and examined on a scanning electron microscope to count the number of "particulates" for several view fields but the result was that substantially no "particulates" could be detected. Further, the mirror-polished surface of the undoped layer was examined on an optical microscope to count the number of dislocations per $cm^2$ appearing as triangular etch pits after etching. The results were that the etch pit density (EPD) was 270/$cm^2$ in the center area of the wafer and 135/$cm^2$ as an average for the diagonally positioned four peripheral points.

Figure 2A:
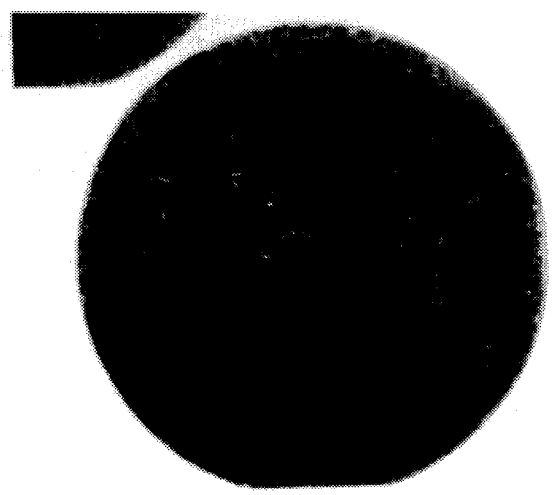
FIGS. 2A, 2B and 2C are each an optical microscopic photograph showing the crystalline structure of dislocations formed on the mirror-polished surface of a silicon wafer.
Figure 2B:
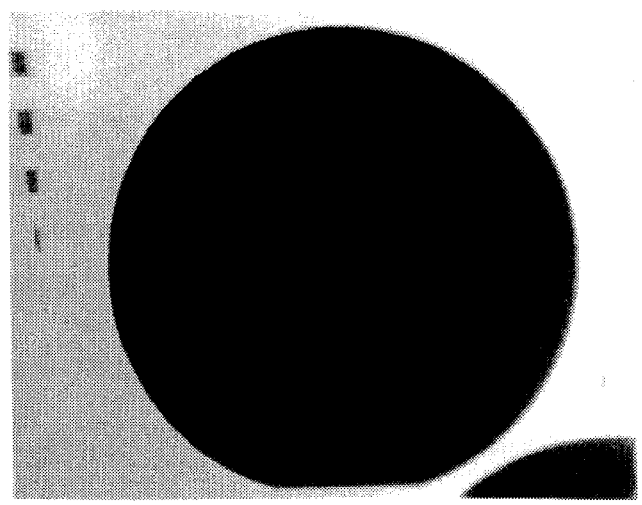
Figure 2C:
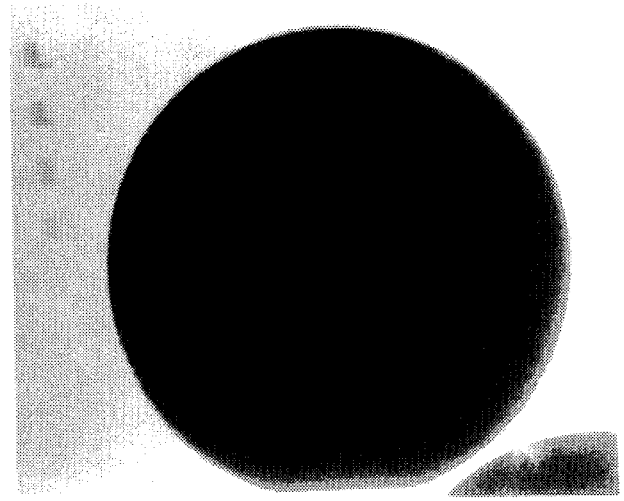
Figure 3:
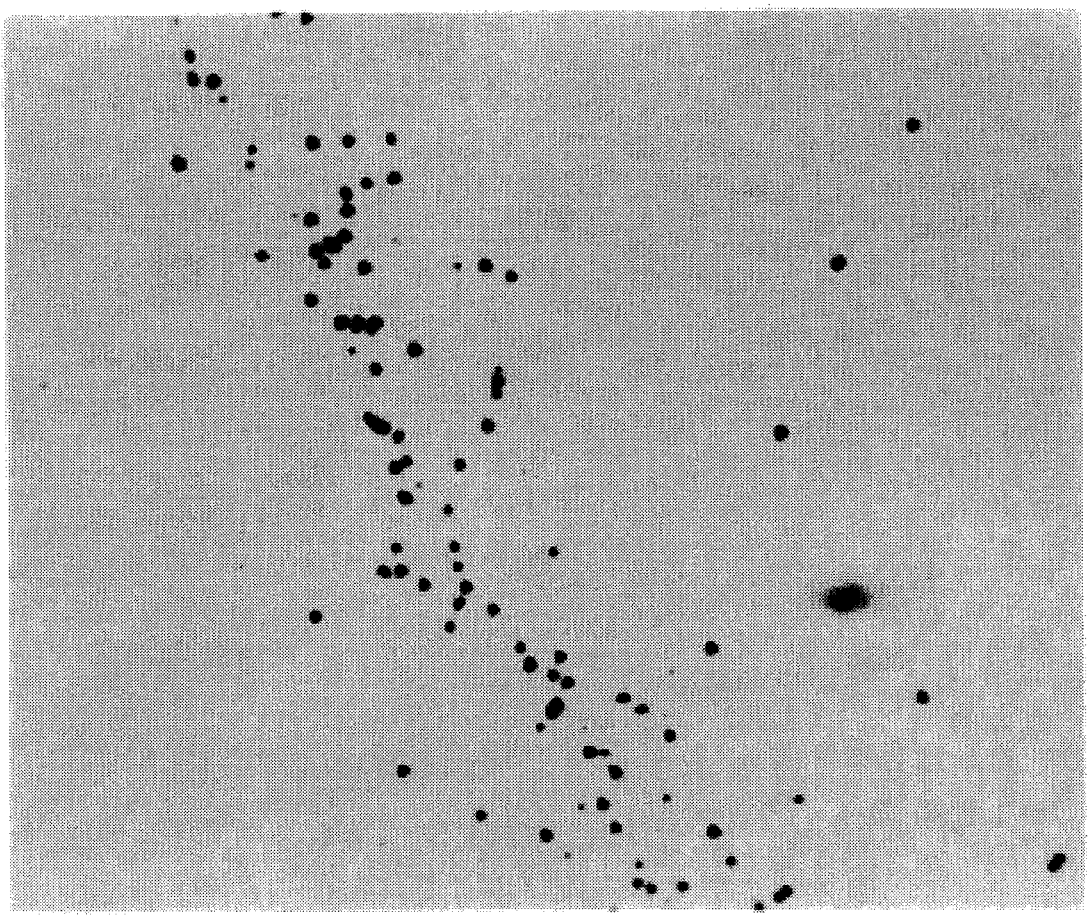
FIG. 3 is an optical microscopic photograph of higher magnification showing the dislocations formed on the mirror-polished surface of a silicon wafer indicating distribution of triangular etch pits.

FIG. 2C of the accompanying drawing is an optical microscopic photograph of the surface of the doped layer showing the level of the above mentioned EPD.

EXAMPLE 2.

The experimental procedure was substantially the same as in Example 1 except that the base wafer subjected to the deposition doping treatment had surfaces of the crystallographic orientation of the (100) plane instead of the (111) plane. The result of the examination of the surface of the doped layer on a scanning electron microscope was that substantially no "particulates" could be detected as in Example 1. Although the optical microscopic examination of the mirror-polished surface of the undoped layer failed to give an exact value of EPD since the etched surface had no triangular etch pits indicating tiny circular depressions only, it could fairly be estimated that the density of dislocations was not substantially larger than in Example 1.

Comparative Example 1.

The procedures for the deposition doping treatment and the drive-in diffusion treatment were substantially the same as in Example 1 except that the (111) base wafer had a thickness of 455 μm instead of 980 μm. The base wafer after the drive-in diffusion treatment was ground and mirror-polished on one surface to completely remove one of the doped layers and to leave an undoped layer having a thickness of 90 μm so that the thus finished discrete substrate had an overall thickness of 250 μm. The results of examination of the thus obtained discrete substrate plate were that substantially no "particulates" could be detected on the surface of the doped layer by the test on the scanning electron microscope while the value of EPD on the surface of the undoped layer was 2070/cm² in the center area of the wafer and 1710/cm² as an average for the diagonally positioned four peripheral points.

FIG. 2B of the accompanying drawing is an optical microscopic photograph of the surface of the undoped layer showing the level of the above mentioned EPD.

Comparative Example 2.

The experimental procedure including the deposition-doping treatment, the drive-in diffusion treatment and finishing by grinding and mirror-polishing of one surface of a (111) silicon wafer of 455 μm thickness was performed in substantially the same manner as in Comparative Example 1 except that the gaseous mixture of the atmosphere in the drive-in diffusion treatment was a 3:1 by volume mixture of nitrogen gas and oxygen gas and the gaseous mixture was introduced into the diffusion tube at a rate of 4 liters per minute. The results of the microscopic examination of the surfaces were that the number of the "particulates" on the surface of the doped layer was 8900 per cm² by the test on a scanning electron microscope and the value of EPD on the surface of the undoped layer was 2520/cm² in the center area of the wafer and 2070/cm² as an average for the diagonally positioned four peripheral points by the test on an optical microscope.

Comparative Example 3.

The experimental procedure was substantially the same as in Comparative Example 2 except that the (111) base wafer after lapping of the surfaces was further subjected to an etching treatment prior to the deposition-doping treatment. The results of the examination of the surface condition were that, although substantially no "particulates" could be detected on the surface of the doped layer by the test on a scanning electron microscope, no exact values of EPD could be given due to the outstandingly non-uniform distribution of the etch pits. FIG. 2A of the accompanying drawing is an optical microscopic photograph of the surface of the undoped layer showing a flocculent pattern.

What is claimed is:

1. A method for the preparation of discrete substrate plates of semiconductor silicon wafer deeply diffusion-doped on one surface which comprises the steps of:

(a) subjecting a single crystal wafer of silicon semiconductor, of which the crystallographic orientation of the surface plane is either along the (111) plane or along the (100) plane of the single crystal silicon, after a simultaneous lapping treatment of both surfaces to a first doping treatment with a dopant by heating the silicon wafer in an atmosphere containing the dopant element so as to deposit the dopant on both of the surfaces of the silicon wafer;

(b) subjecting the silicon wafer after the first doping treatment with the dopant to a second doping treatment of the dopant by heating the silicon wafer at a temperature in the range from 1250° to 1310° C. in an atmosphere of a gaseous mixture consisting of from 99.5% to 90% by volume of argon or helium and from 0.5% to 10% by volume of oxygen for a length of time in the range from 20 hours to 450 hours so as to cause diffusion of the dopant to the core portions of the silicon wafer from the respective surfaces leaving an undoped layer in-between;

(c) slicing the silicon wafer after step (b) on an internal-blade slicing machine with an annular blade along the center plane of the undoped layer into two silicon wafers each having a thickness smaller than one half of the thickness of the starting silicon wafer and each having a laminar structure consisting of a doped layer and an undoped layer; and (d) lapping the surface of the undoped layer of each of the silicon wafers obtained in step (c) into a mirror-polished surface, the thickness of the single crystal silicon in step (a) and the thickness of the annular blade in step (c) being correlated by the inequalities $$2(x_j+x_i)+t_c+75 \leq t_2 \leq 2(x_j+x_i)+t_c+300,$$

in which $t_2$ is the thickness of the single crystal wafer in μm, $t_c$ is the thickness of the annular blade in μm, $x_j$ is the thickness in μm of each of the doped layers formed in step (a), and $x_i$ is the thickness in μm of the undoped layer in each of the discrete substrates after step (d).

* * * * *